United States Patent
Xu et al.

(10) Patent No.: US 10,694,628 B2
(45) Date of Patent: Jun. 23, 2020

(54) CIRCUIT HOLDING DEVICE FOR DISPLAY MODULE AND DISPLAY DEVICE

(71) Applicant: BOE Technology Group Co., Ltd., Beijing (CN)

(72) Inventors: Jian Xu, Beijing (CN); Xinyin Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 33 days.

(21) Appl. No.: 15/538,062

(22) PCT Filed: Nov. 24, 2016

(86) PCT No.: PCT/CN2016/107090
§ 371 (c)(1),
(2) Date: Jun. 20, 2017

(87) PCT Pub. No.: WO2017/114039
PCT Pub. Date: Jul. 6, 2017

(65) Prior Publication Data
US 2017/0374753 A1    Dec. 28, 2017

(30) Foreign Application Priority Data
Dec. 31, 2015   (CN) .................... 2015 2 1134565 U

(51) Int. Cl.
*H05K 5/00* (2006.01)
*G09F 9/00* (2006.01)

(52) U.S. Cl.
CPC ............. *H05K 5/0065* (2013.01); *G09F 9/00* (2013.01); *H05K 5/0017* (2013.01)

(58) Field of Classification Search
CPC .... G09F 9/30; G09F 9/00; H05K 5/02; H05K 5/0065; H05K 5/0017
See application file for complete search history.

(56) References Cited

U.S. PATENT DOCUMENTS 5,455,743 A * 10/1995 Miyajima ................ H04N 5/64
200/296
5,769,374 A *  6/1998 Martin .................. G06F 1/1605
248/221.11

(Continued)

FOREIGN PATENT DOCUMENTS

CN   101315146 A   12/2008
CN   103077666 A    5/2013

(Continued)

OTHER PUBLICATIONS

Mar. 7, 2017—(WO) International Search Report and Written Opinion Appn PCT/CN2016/107090 with English Tran.

*Primary Examiner* — Jinhee J Lee
*Assistant Examiner* — Theron S Milliser
(74) *Attorney, Agent, or Firm* — Banner & Witcoff, Ltd.

(57) ABSTRACT

A circuit holding device for a display module and a display device are disclosed. The circuit holding device includes an external circuit terminal component, wherein the external circuit terminal component is disposed external to the display module, and a circuit board is held in the external circuit terminal component, the circuit board and the display module are electrically connected to each other. The circuit holding device can accommodate multiple external circuits in one terminal component, thereby making the connection between the external circuits and the display module easy and convenient.

19 Claims, 3 Drawing Sheets

(56) References Cited

U.S. PATENT DOCUMENTS

| | | | | |
|---|---|---|---|---|
| 5,777,610 | A * | 7/1998 | Sugimoto | H05K 1/147 345/206 |
| 7,034,902 | B2 * | 4/2006 | Tajima | G06F 1/1601 248/221.11 |
| 7,372,704 | B2 * | 5/2008 | Jeong | H05K 5/02 348/836 |
| 7,656,666 | B2 * | 2/2010 | Jeong | H05K 7/20963 313/582 |
| 7,826,203 | B2 * | 11/2010 | McCoy | H01R 31/06 361/679.01 |
| 7,871,300 | B2 * | 1/2011 | McCoy | H05K 5/0017 439/676 |
| 8,270,651 | B2 * | 9/2012 | McCarty | H04N 5/64 181/150 |
| 2002/0027613 | A1 * | 3/2002 | Tajima | G06F 1/1601 348/552 |
| 2002/0080297 | A1 * | 6/2002 | Sung | G02F 1/133308 349/58 |
| 2005/0185801 | A1 * | 8/2005 | McCarty | H04N 5/64 381/87 |
| 2005/0247787 | A1 * | 11/2005 | Von Mueller | G06F 1/1632 235/449 |
| 2007/0117418 | A1 * | 5/2007 | Azuma | G02F 1/133308 439/67 |
| 2007/0230132 | A1 * | 10/2007 | Lee | H05K 7/20963 361/707 |
| 2008/0074408 | A1 * | 3/2008 | Jang | G02F 1/13452 345/206 |
| 2011/0007042 | A1 * | 1/2011 | Miyaguchi | G02F 1/133305 345/204 |
| 2011/0198395 | A1 * | 8/2011 | Chen | G06K 7/084 235/380 |
| 2011/0317401 | A1 * | 12/2011 | Ling | G02B 6/0088 362/97.2 |
| 2011/0317415 | A1 * | 12/2011 | Yamanaka | H05K 5/0017 362/235 |
| 2013/0051071 | A1 * | 2/2013 | Lee | G02F 1/133308 362/611 |
| 2013/0294047 | A1 * | 11/2013 | Moon | H04M 1/0277 362/23.03 |
| 2013/0329162 | A1 * | 12/2013 | Fujii | H05K 7/14 349/58 |
| 2014/0002969 | A1 * | 1/2014 | Hwang | H05K 5/0017 361/679.01 |
| 2014/0055975 | A1 * | 2/2014 | Gu | H05K 5/0017 361/807 |
| 2014/0232942 | A1 * | 8/2014 | Yahata | H04N 5/64 348/725 |
| 2014/0259931 | A1 * | 9/2014 | Plummer | H05K 7/14 49/70 |
| 2014/0262481 | A1 * | 9/2014 | Khoury | F24F 11/30 174/480 |
| 2014/0355805 | A1 * | 12/2014 | Park | H04N 5/64 381/333 |
| 2015/0062927 | A1 * | 3/2015 | Hirakata | H01L 51/0097 362/362 |
| 2015/0154581 | A1 * | 6/2015 | Dorsey | G06Q 20/32 705/17 |
| 2015/0196867 | A1 * | 7/2015 | Ries | B01D 53/0407 429/9 |
| 2015/0271941 | A1 * | 9/2015 | Lu | H01H 13/705 361/752 |
| 2015/0282293 | A1 * | 10/2015 | Lim | H05K 5/0017 361/749 |
| 2015/0289397 | A1 * | 10/2015 | Kim | H05K 5/0017 361/692 |
| 2015/0304599 | A1 * | 10/2015 | Yamamoto | H04N 5/645 348/836 |
| 2016/0238853 | A1 * | 8/2016 | Kimura | G02F 1/133308 |
| 2017/0171997 | A1 * | 6/2017 | Xu | H05K 5/02 |
| 2017/0374753 | A1 * | 12/2017 | Xu | H05K 5/0065 |

FOREIGN PATENT DOCUMENTS

| | | |
|---|---|---|
| CN | 203102761 U | 7/2013 |
| CN | 103730065 A | 4/2014 |
| CN | 205281986 U | 6/2016 |
| JP | 2010210956 A | 9/2010 |

* cited by examiner

CIRCUIT HOLDING DEVICE FOR DISPLAY MODULE AND DISPLAY DEVICE

The application is a U.S. National Phase Entry of International Application No. PCT/CN2016/107090 filed on Nov. 24, 2016, designating the United States of America and claiming priority to Chinese Patent Application No. 201521134565.5, filed on Dec. 31, 2015. The present application claims priority to and the benefit of the above-identified applications and the above-identified applications are incorporated by reference herein in their entirety.

FIELD OF THE ART

The present disclosure relates to the field of display technologies, more particularly, to a circuit holding device for a display module and a display device.

BACKGROUND

Currently, in a conventional display device such as a monitor or a television, different circuit terminals are connected to the display device through different wires, which makes the assembly of the device very difficult. Moreover, many wires can also easily cause circuit fault, thereby reducing reliability.

SUMMARY

The disclosure provides a circuit holding device, which allows a plurality of external circuits to be collectively accommodated in the same terminal component to form as a unity, thereby making the connection easy and convenient, allowing the assembly to be fast and easy.

In first aspect of the disclosure, it is provided a circuit holding device for a display module, comprising an external circuit terminal component, the external circuit terminal component being disposed external to the display module, a circuit board being held in the external circuit terminal component, the circuit board and the display module being electrically connected to each other.

In second aspect of the disclosure, it is provided a display device comprising the above circuit holding device.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the description, unless otherwise stated, "a plurality of" means two or more.

Figure 1:
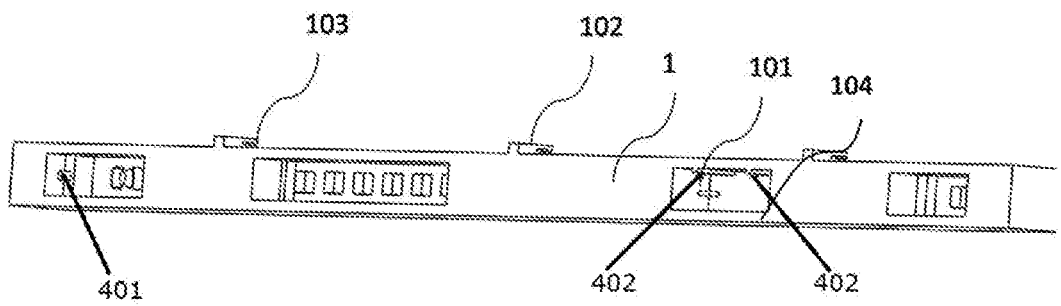
FIG. 1 schematically illustrates a circuit holding device in accordance with an embodiment of the disclosure.
Figure 2:
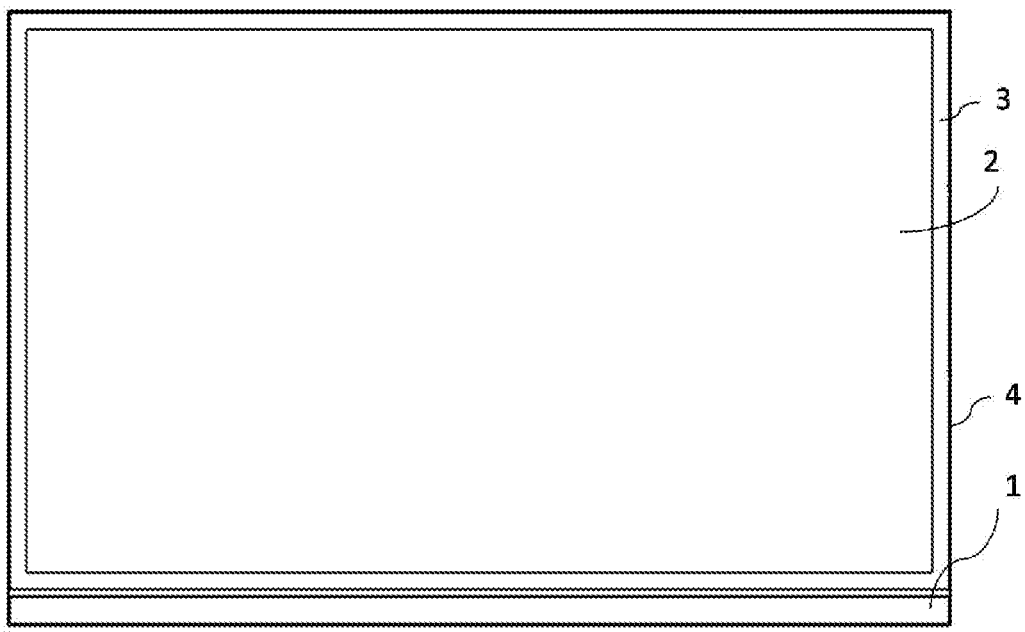
FIG. 2 is a front view of a display module and a circuit holding device in accordance with an embodiment of the disclosure.
Figure 3:
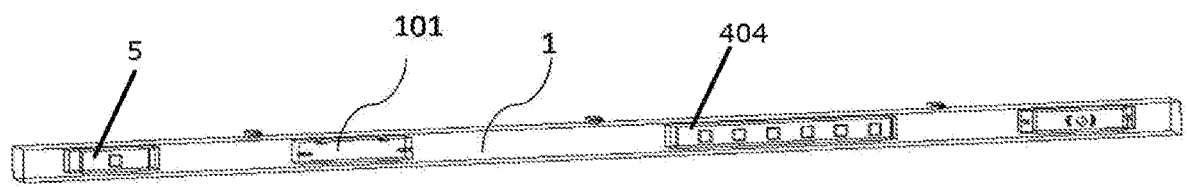
FIG. 3 schematically illustrates positions of grooves of a circuit holding device in accordance with an embodiment of the disclosure.

As illustrated in FIGS. 1 to 3, an embodiment of the disclosure provides a circuit holding device for a display module 4; the circuit holding device comprises an external circuit terminal component 1. The external circuit terminal component 1 is disposed external to the display module 4, and a circuit board is integrally held in the external circuit terminal component 1, the circuit board and the display module 4 is electrically connected with each other. It is noted that the number of the circuit board is not defined here, which may be increased or decreased based on different circuit functions. That is, there may be one or a plurality of circuit boards, which is/are integrated into the external circuit terminal component 1 to form as a unity. Circuit boards in the terminal component are electrically connected to reserved signal interfaces of the display module through signal lines, allowing the circuit boards to be turned on and work. Such a structure makes the connection between the external circuit terminal component 1 and the display module 4 easier and more convenient. In the meantime, it makes the assembly of the display module 4 more convenient by disposing circuits which were originally inside the display module 4 to be located outside the display module 4.

In at least some of embodiments, the external circuit terminal component 1 comprises a casing 104, and a shape of the casing is for example a rectangular solid, with a length and a width set based on a size of the display module 4. As illustrated in FIG. 2, when the display panel 2 is placed facing a user, the casing is detachably connected to a bottom of the display module 4. As illustrated in FIG. 3, casing is provided with at least one groove 101 for accommodating the circuit board 5, and the circuit board 5 in the groove 101 is connected to a reserved signal interface of the display module 4 by way of a signal line. It can be contemplated that the number of the groove is not limitative to the disclosure; instead, it may depend on the number of circuit boards to be connected. As an example, based on circuit functions, a circuit board for wirelessly receiving and transmitting signals, a circuit board for receiving and transmitting 3D signals, a circuit board for sensing backlight and a circuit board for capacitive sensing touch events may be provided. In this case, the casing of the external circuit terminal component 1 has four grooves 101, which allows circuit boards to be accommodated in the four grooves respectively.

Figure 4:
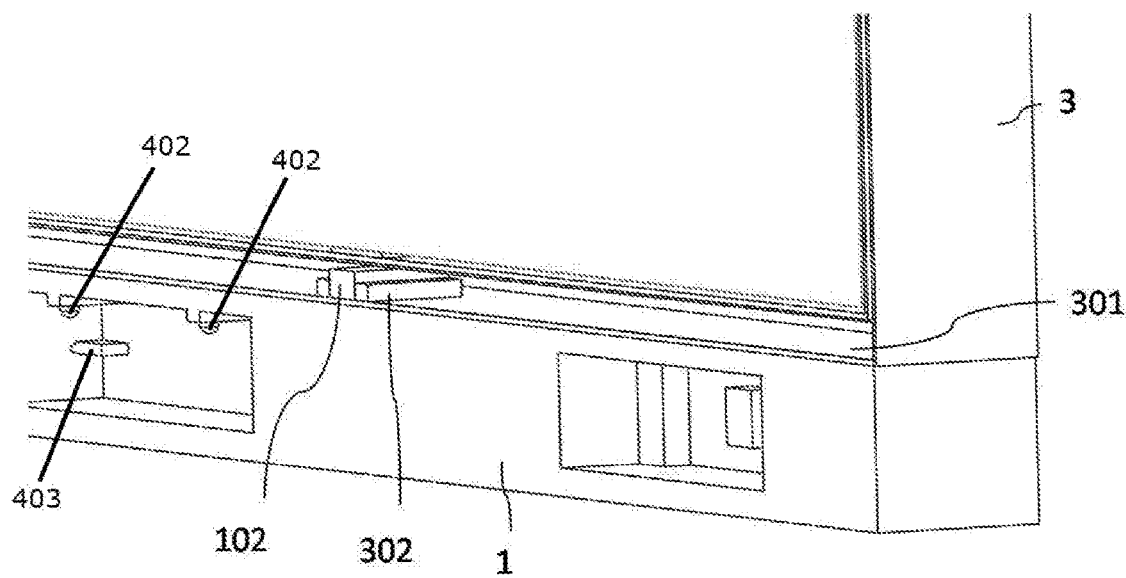
FIG. 4 is a partial view of a bottom of a front frame after assembly in accordance with an embodiment of the disclosure.

Shapes of the grooves 101 and the connection approaches between the grooves 101 and the circuit board may be designed based on different shapes of the circuit board, in order to match with the shapes of the circuit boards. As an example, a circuit board and the groove 101 are connected with each other by using interference fit, making it easy to assemble or separate them. For example, as illustrated in FIG. 1, an element 401 is provided in the groove 101, optionally, two elements 402 are provided in another groove 101. Both the elements 401 and 402 serve to achieve the interference fit between the circuit board and the groove 101. In other embodiments, a limit component is further provided, so as to secure the circuit board. For example, as illustrated in FIG. 4, the limit component 403 is provided in the groove 101. That is, the circuit board and the groove 101 are secured and connected with each other by using the limit component, which also makes it easy to assemble them. The groove 101 and the limit component may be for example fabricated through injection molding.

To make it easy for the circuit board to transmit and receive signals, for example, the groove 101 has an opening. The opening is open forward to face the user (that is on a front side of casing) or open backward to be away from the user (that is on the back side of the casing).

In at least some of embodiments, the circuit holding device further comprises a transflective film, the transflective film overlays the opening of the groove, for example, as illustrated in FIG. 3, the transflective film 404 overlays the opening of the groove 101. As an example, the transflective film is adhered to a surface of a front side of the external circuit terminal component 1 (that is, a surface of the front side of the casing), and the transflective film directly overlays the opening of the groove 101. Such a transflective film has a hollowed-out structure which makes it impossible to see the terminal component when viewed from the front side, but the circuit signals may transmit through the transflective film. As an example, the signals include but are not limited to electromagnetic signals, acoustic signal, light signals. As an example, the signal is an infrared signal.

Alternatively, a material of the portion of the casing at position corresponding to the groove 101 is made of light-transmissive plastic, which allows the circuit signals to transmit. The opening of the groove is covered by the light-transmissive plastic, and a layer of transflective film is further provided above the plastic (for example, the transflective film overlays the groove which is open forward to face the user), which also makes the circuit board invisible when viewed form the front. The above transflective film may be made of for example acrylic, PET and may be formed via a coating process.

Moreover, the circuit holding device may adapt to display modules 4 of different sizes. In at least some of embodiments, the display module 4 comprises a display panel 2 and a front frame 3 disposed around a periphery of the display panel 2. Accordingly, the casing 104 is detachably connected to a bottom 301 of the front frame 3. Detachable connection may be of various specific forms. As an example, a plug connector is provided on the casing, and a socket connector is provided on the front frame 3, the plug connector and socket connector are engaged with each other. The plug connector may be configured with different number and at different locations, according to an overall length of the exterminable circuit terminal component 1.

Figure 5:
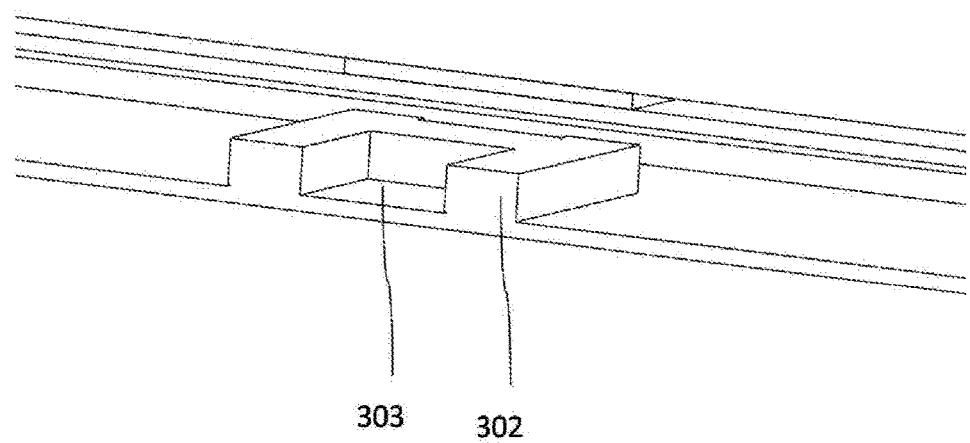
FIG. 5 schematically illustrates a socket connector in accordance with an embodiment of the disclosure.
Figure 6:
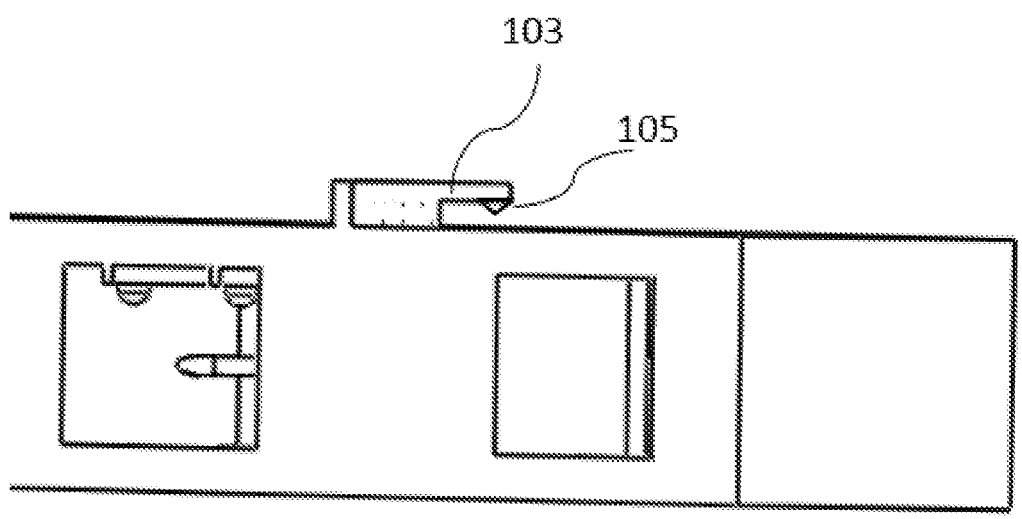
FIG. 6 schematically illustrates a hook in accordance with an embodiment of the disclosure.

For example, with reference to FIGS. 1, 4 and 5, the plug connector comprises a connection portion 102 and a protrusion portion 103, and the protrusion 103 is disposed on the connection portion 102, for example on both sides thereof. Moreover, a hook 105 is provided on the protrusion 103, which is illustrated in FIG. 6. The socket connector comprises a flat part 302 and a slot 303 formed in the flat part. The slot 303 is concave, making it possible for the connection portion 102 to be embedded in the slot 303. In the meantime, the hook extends backwards so as to be hooked to an end of the flat part 302. Such a connection approach is easy to assemble. In the meantime, the structure is simple and suits for mass production.

Another embodiment of the disclosure further provides a display device, which comprises the circuit holding device for the display module as described in any of the above embodiments.

In the above embodiments, the multiple external circuits are integrated into the same terminal component, thereby realizing an integral function. Such a solution makes the connection between the external circuits and the display module easy and convenient. In the meantime, it makes the assembly of the display module more convenient by disposing the circuits which were originally inside the display module to be located outside the display module What is described above is related to the illustrative embodiments of the disclosure only and not limitative to the scope of the disclosure; the scopes of the disclosure are defined by the accompanying claims.

The present application claims priority from Chinese Application No. 201521134565.5, filed on Dec. 31, 2015, the disclosure of which is incorporated herein by reference in its entirety.

What is claimed is:

1. A circuit holding device for a display module, the display module comprising a display panel and a front frame disposed around a periphery of the display panel, the circuit holding device comprising:
    an external circuit terminal component, disposed external to the display panel and the front frame, comprising:
        a casing, the casing having an upmost surface perpendicular to a plane of the display panel; and
        a plug connector, arranged on the upmost surface, the plug connector comprising a first portion and a second portion, the first portion being parallel to the upmost surface of the casing and configured to extend towards a backside of the display panel, the second portion being perpendicular to the upmost surface of the casing and being configured to detachably connect to a bottom of the front frame of the display panel through the first portion; and
    a circuit board, accommodated in the external circuit terminal component and electrically connected to the display module.

2. The circuit holding device of claim 1, wherein the casing is provided with a groove for holding the circuit board.

3. The circuit holding device of claim 2, wherein the circuit board and the groove are connected to each other using an interference fit.

4. The circuit holding device of claim 2, wherein the circuit board and the groove are secured and connected to each other by using a limit component.

5. The circuit holding device of claim 2, wherein an opening of the groove is located on a front of the casing or on a back of the casing.

6. The circuit holding device of claim 5, wherein the circuit holding device further comprises a transflective film overlaying on the opening of the groove.

7. The circuit holding device of claim 1, wherein a socket connector is provided on the front frame, and wherein the plug connector and the socket connector are configured to engage with each other.

8. The circuit holding device of claim 7, wherein the first portion comprises a protrusion portion, the second portion comprises a connection portion, and the protrusion portion is disposed on the connection portion.

9. The circuit holding device of claim 8, wherein the socket connector comprises a flat part and a slot formed in the flat part, wherein the connection portion is embedded in the slot.

10. The circuit holding device of claim 9, wherein a hook is disposed on the protrusion portion, and the hook is hooked to an end of the flat part.

11. A display device comprising the circuit holding device of claim 1.

12. The display device of claim 11, wherein the casing is provided with a groove for holding the circuit board.

13. The display device of claim 12, wherein the circuit board and the groove are connected to each other using an interference fit.

14. The display device of claim 12, wherein the circuit board and the groove are secured and connected to each other by using a limit component.

15. The display device of claim 12, wherein an opening of the groove is located on a front of the casing or on a back of the casing.

16. The display device of claim 15, wherein the circuit holding device further comprises a transflective film overlaying on the opening of the groove.

17. The circuit holding device of claim 1, wherein the casing is disposed outside of a space defined by the front frame of the display module and has a shape of rectangular solid.

18. The circuit holding device of claim 1, wherein the external circuit terminal component is disposed outside of a space defined by the front frame of the display module.

19. The circuit holding device of claim 1, wherein the front frame comprises an opening, the opening is configured to accommodate the display panel, and the external circuit terminal component is in a shape of an elongated cuboid.

* * * * *